United States Patent [19]
Voegeli

[11] 3,953,841
[45] Apr. 27, 1976

[54] CLOSED LOOP BUBBLE LATTICE SYSTEM AND METHOD FOR STABILIZING

[75] Inventor: Otto Voegeli, San Jose, Calif.

[73] Assignee: International Business Machines Corporation, Armonk, N.Y.

[22] Filed: Dec. 30, 1974

[21] Appl. No.: 537,166

[52] U.S. Cl. .......................... 340/174 TF
[51] Int. Cl.² ............................ G11C 11/14
[58] Field of Search ................. 340/174 TF

[56] References Cited
UNITED STATES PATENTS

| | | | |
|---|---|---|---|
| 3,701,129 | 10/1972 | Copeland | 340/174 TF |
| 3,913,079 | 10/1975 | Rosier | 340/174 TF |

Primary Examiner—James W. Moffitt
Attorney, Agent, or Firm—Joseph E. Kieninger

[57] ABSTRACT

A closed loop bubble lattice system and a method for stabilizing the same is disclosed. The closed loop bubble lattice system contains at least one portion being curved wherein the lattice parameter increases with the radius. In a preferred embodiment a radially varying bias field is associated with the curved portion in a manner to provide an equilibrium lattice constant at a bubble domain position which is substantially the same as the lattice parameter for that position. A method of reducing the stress in the curved portion of the bubble domain lattice system to provide stabilization therefor involves the step of varying one or more of the parameters which affect the equilibrium lattice constant.

13 Claims, 6 Drawing Figures

U.S. Patent April 27, 1976 3,953,841
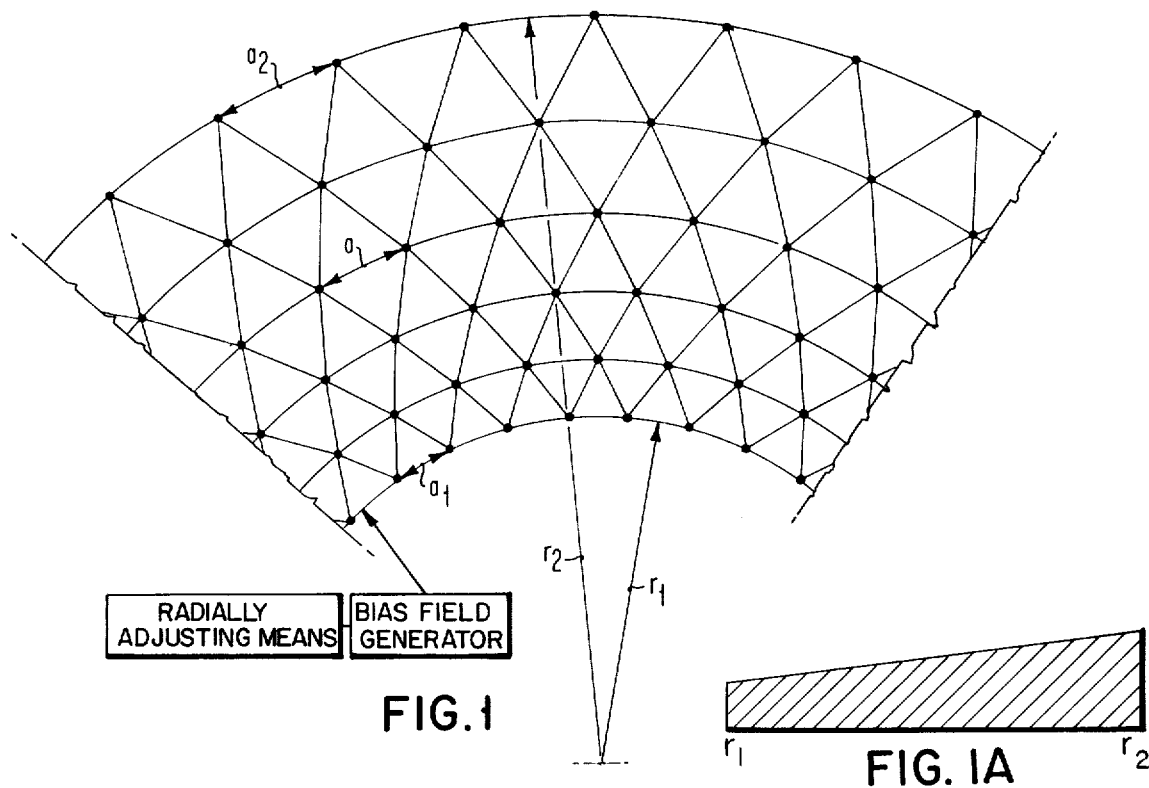
FIG.1
FIG. 1A
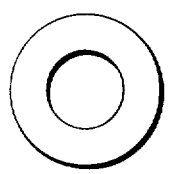
FIG.2
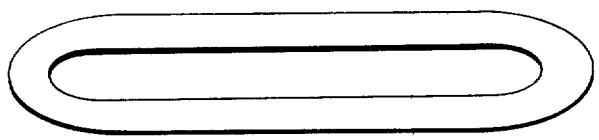
FIG.3
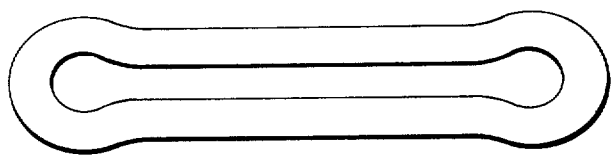
FIG.4
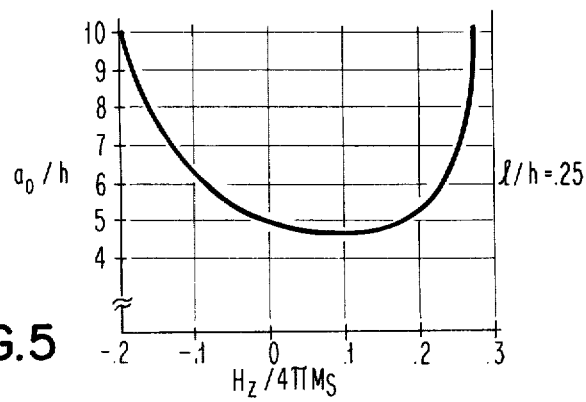
FIG.5

CLOSED LOOP BUBBLE LATTICE SYSTEM AND METHOD FOR STABILIZING

FIELD OF THE INVENTION

This invention relates to bubble domain lattices and more particularly to a bubble domain lattice system suitable for use in a closed loop.

DESCRIPTION OF THE PRIOR ART

Bubble domains arranged in a lattice are described in copending U.S. Patent Applicatons, Ser. Nos. 395,336, filed on Sept. 7, 1973 and 494,940, filed on Aug. 5, 1974, and assigned to the assignee of the present invention. The aforementioned applications are incorporated herewith by reference thereto. As described therein the bubble domain lattice consists of a plurality of rows and columns of bubble domains which occupy a spatial arrangement which is determined to a substantial extent by the interaction between the bubbles.

Heretofore bubble domain lattices have been in the form of a parallelogram in which there are parallel rows and columns of bubble domains. In current bubble domain lattice system designs the bubbles are translated parallel to the rows of the storage axis to position the addressed bubbles in an access channel. When the bubbles are in the access channel, these bubbles can be translated within the lattice along the channel. Such translation along the column axis is used to enter new bubbles into the lattice or to remove existing bubbles from the lattice.

Present designs of bubble lattice systems all rely on rectilinear lattice translation for data accessing. This requires means for bidirectional lattice translation and buffer regions on both sides of the lattice. In certain applications in which buffer regions and/or bidirectional accessing and translation are not suitable, the bubble lattice requires some type of closed loop arrangement. Close loop bubble lattice systems may be driven with unidirectional translation means.

A bubble lattice system having a closed loop design has certain problems. A primary problem or obstacle would be that the lattice boundary cannot follow a straight line as with the standard lattice designs because the closed loop bubble lattice systems require at least one curved lattice segment. Maintaining a regular lattice in a curved portion presents a problem which must be overcome in order to have a satisfactory closed loop lattice system. In any curved portion a regular lattice is retained only if the lattice parameter increases with the radius of curvature. Unless the outer lattice boundary is very close to the inner lattice boundary, a regular lattice arrangement is not maintained throughout the whole curved segment.

SUMMARY OF THE INVENTION

It is an object of this invention to provide an improved bubble lattice design.

It is another object of this invention to provide a closed loop type bubble lattice design.

It is still another object of this invention to provide a bubble lattice design having a curved portion with reduced stress therein.

It is yet another object of this invention to provide a method of reducing the stress in a curved bubble lattice segment.

These and other objects are accomplished by a bubble lattice system having a curved portion therein wherein the lattice parameter increases with the radius. Associated with the curved portion in a preferred embodiment is a radially varying bias field wherein the strength of said field at any position occupied by a bubble domain provides an equilibrium lattice constant which is substantially the same as the lattice parameter at that position. The method of reducing the stress in the curved portion of a bubble domain lattice system involves the step of varying the parameters which affect the equilibrium lattice constant in such a manner as to provide an equilibrium lattice constant which is substantially the same as the lattice parameter at any given position in the curved portion.

Other objects of this invention will be apparent from the following detailed description, reference being made to the accompanying drawing wherein various embodiments of the bubble domain lattice system are shown.

BRIEF DESCRIPTION OF THE DRAWINGS

FIG. 1 is a section of a curved portion of the bubble domain lattice system. FIG. 1A is a cross-sectional view of FIG. 1.

FIGS. 2, 3 and 4 are top views of different embodiments of the invention.

FIG. 5 is a graph showing the relationship between the bias field and the equilibrium lattice constant.

DESCRIPTION OF THE ILLUSTRATIVE EMBODIMENTS

Closed loop bubble lattice systems have at least one curved lattice segment of the type shown in FIG. 1. The curved lattice segment has an inner row of bubble domains with a radius of curvature, $r_1$, and an outer row of bubble domains with a radius of curvature, $r_2$, as defined by some lattice isolation means. Typical lattice isolation means which may be used are step changes in the bubble material layer thickness such as dams, grooves, and the like. The lattice parameter ($a$), that is, the distance between two adjacent bubble domains, increases from a value of $a_1$ at $r_1$, to a larger value $a_2$ at $r_2$. In a preferred embodiment the lattice parameter, $a$, increases in direct proportion to the increase in the radius of curvature, $r$.

Since this varying lattice parameter is thus generally different from the equilibrium lattice constant, stress arises with the lattice. In accordance with the present invention at least one of the parameters which affect the equilibrium lattice constant, $a_0$, in the curved lattice segment is varied radially to provide an equilibrium lattice constant, $a_0$, which is substantially the same as the lattice parameter, $a$, at any given position. When these two terms are substantially equal, the lattice stress is substantially eliminated. Parameters which may be altered to affect the equilibrium lattice constant are the bias field that is applied to the film as well as the magnetization, thickness, and anistropy of the film itself.

In a preferred embodiment the bias field applied to the curved segment is radially varied so that equilibrium lattice constant at any given bubble position in the curved segment is substantially the same as the lattice parameter at that same position. By applying the radially varied bias field in such a manner the stress is for all practical purposes substantially eliminated, thereby yielding a stable bubble lattice segment. The bias field may be radially varied by any of the numerous methods well known in the art. Such methods are described in the assignee's copending patent application Serial No. 395,336 filed Sept. 7, 1973 as well as in "Principles and Applications of Electromagnetic Fields" by Plonsey and Collin, McGraw-Hill Book Co. (1961) on pages 208 to 211, and by the use of "Universal Tables for Magnetic Fields of Filamentary and Distributed Circular Currents" by Hart, American Elsevier Publishing Co. (1967).

The stress in the curved segment may also be substantially eliminated by changing the properties of the film itself which affect the equilibrium constant. The magnetization, thickness and anisotropy of the magnetic film which supports the bubble domains may be radially varied so that the equilibrium lattice constant at a given position is equal to the lattice parameter at that same position. FIG. 1A illustrates the thickness of the magnetic film section of FIG. 1 wherein the thickness varies radially so that the equilibrium lattice constant at a given position is equal to the lattice parameter at that same position. The magnetization and/or anisotropy of the film may be varied by radially changing the composition of the film material or by changing the temperature. Changing the composition of vary these properties is preferred over varying the temperature for practical considerations. Varying the composition includes property changes in the crystalline structure or configuration which are affected by annealing, doping, ion implantation and other techniques of this type.

Closed loop bubble lattice systems having at least one curved segment may take on any one of an infinite number of configurations. One configuration in the form of a continuous curve lattice segment is shown in FIG. 2. This configuration because of its circular symmetry permits one to use stress relieving means having a similar symmetry. Stress relieving means having a circular symmetry usually permit ease of fabrication when compared with configurations having a lesser symmetry.

FIG. 3 is a closed loop bubble lattice system having two elongated straight portions joined together at each end with an elipsoidal curved segment. Since the straight lattice portions are strain free lattice segments having a constant lattice parameter, $a$, they permit use of access channels having a periodic configuration.

FIG. 4 is another embodiment for maximum storage of the bubble domains having two straight portions which are joined at each end with a curved lattice segment. Since the two straight portions are in close proximity, improved utilization of the bubble material is obtained. In closed loop designs, such as the ones shown in FIGS. 3 and 4, it is desirable that there exist only gradual curvature changes along the circumference of the lattice isolation means. Abrupt curvature changes are undesirable since they would necessitate similarly abrupt changes of bubble positions within the lattice.

As mentioned previously, a preferred embodiment is to apply across any curved lattice segment a radially varying bias field to the film. In FIG. 5 a graph illustrates the relationship between the equilibrium lattice constant, $a_o$, and the applied bias field, $H_z$. $A_o$ is shown normalized to the film thickness, $h$, and $H_z$ is shown normalized to the film's magnetization $4\pi M_s$.

The data shown in FIG. 5 are given for a typical bubble material having an $l/h$ value of 0.25. The characteristic length, $l$, is a well known material value and $h$ is the film thickness.

In selecting a suitable bias field, consideration must be given to the field dependence of the domain diameter, $d$, which decreases with the bias field. Domain size is important because the rigidity of the lattice depends on the ratio of the bubble domain to the lattice parameter, $d/a$. Experimental observation shows that the lattice becomes susceptible to irreversible changes in the ordered domain arrangement within the lattice when $d/a$ is substantially smaller than 0.5. In the preferred mode of operation the bias field is applied so that the ratio of $d/a$ remains large, preferably $>0.5$, and comparatively constant. This condition is satisfied by decreasing the bias field with increasing radius across the curved portion.

Although several preferred embodiments of this invention have been described, it is understood that numerous variations may be made in accordance with the principle of this invention and the claims.

What is claimed is:

1. A bubble domain lattice system adapted to provide a closed loop propagation arrangement comprising
    a first portion of said lattice system being curved wherein the lattice parameter increases with the radius, and
    a radially varying bias field associated with said first portion wherein the strength of said field at any position occupied by a bubble domain provides an equilibrium lattice constant at said position which is substantially the same as the lattice parameter at said position.

2. A bubble domain lattice system as described in claim 1 including a second portion of said lattice system being substantially straight and associated with said first portion wherein the radii of curvature of said first portion adjacent said second portion change gradually.

3. A bubble domain lattice system as described in claim 1 including a second portion of said lattice system being curved wherein the lattice parameter increases with the radius, and
    a radially varying bias field associated with said second portion wherein the strength of said field at any position occupied by a bubble domain provides an equilibrium lattice constant at said position which is substantially the same as the lattice parameter at said position.

4. A bubble domain lattice system as described in claim 3 including a third portion of said lattice system being substantially straight and associated with said first portion wherein the radii of curvature of said first portion adjacent said third portion change gradually.

5. A method of reducing the stress in the curved portion of a bubble domain lattice system wherein the lattice parameter of the curved system increases with the radius comprising the steps of
    radially varying in the curved portion at least one of the parameters which affect the equilibrium constant of the curved portion whereby the equilibrium lattice constant at a position in the curved portion is substantially the same as the lattice parameter at said position.

6. A method as described in claim 5 including the step of maintaining the ratio of the bubble diameter to the lattice parameter relatively constant and greater than 0.5.

7. A method of reducing the stress in the curved portion of a bubble domain lattice system wherein the lattice parameter of the curved system increases with the radius comprising the steps of radially varying the bias field associated with the curved portion whereby the strength of said field at any position occupied by a bubble domain in said curved portion provides an equilibrium lattice constant at said position which is substantially the same as the lattice parameter at said position.

8. A method as described in claim 7 including the step of maintaining the ratio of the bubble diameter to the lattice parameter relatively constant and greater than 0.5.

9. A method of reducing the stress in the curved portion of a bubble domain lattice system wherein the lattice parameter of the curved system increases with the radius comprising the steps of radially varying the magnetization of the bubble domain material in the curved portion whereby the magnetization of the material at any position occupied by bubble domain in said curved portion provides an equilibrium lattice constant at said position which is substantially the same as the lattice parameter at said position.

10. A method as described in claim 9 whereby the magnetization is radially varied by radially varying the composition of the bubble domain material.

11. A method of reducing the stress and the curved portion of a bubble domain lattice system wherein the lattice parameter of the curved system increases with the radius comprising the steps of radially varying the thickness of the bubble domain material in the curved portion whereby the thickness of said material at any position occupied by bubble domain in said curved portion provides an equilibrium lattice constant at said position which is substantially the same as the lattice parameter at said position.

12. A method of reducing the stress in the curved portion of a bubble domain lattice system wherein the lattice parameter of the curved system increases with the radius comprising the steps of radially varying the anisotropy of the material in the curved portion whereby the anisotropy at any position occupied by a bubble domain in said curved portion provides an equilibrium lattice constant at said position which is substantially the same as the lattice parameter at said position.

13. A method as described in claim 12 whereby the anisotropy is radially varied by radially varying the composition of the bubble domain material in the curved portion.

* * * * *